(12) United States Patent
Nabhane et al.

(10) Patent No.: US 9,542,267 B2
(45) Date of Patent: Jan. 10, 2017

(54) ENHANCED RECOVERY MECHANISMS

(71) Applicant: Broadcom Corporation, Irvine, CA (US)

(72) Inventors: Walid Nabhane, Long Valley, NJ (US); Veronica Alarcon, San Jose, CA (US); Mark Norman Fullerton, Austin, TX (US); Ajmal A. Godil, San Diego, CA (US); Zhongmin Zhang, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 491 days.

(21) Appl. No.: 13/950,769

(22) Filed: Jul. 25, 2013

(65) Prior Publication Data
US 2014/0218078 A1 Aug. 7, 2014

Related U.S. Application Data

(60) Provisional application No. 61/759,470, filed on Feb. 1, 2013, provisional application No. 61/833,598, filed
(Continued)

(51) Int. Cl.
*G05F 1/625* (2006.01)
*G06F 11/10* (2006.01)
(Continued)

(52) U.S. Cl.
CPC ........... *G06F 11/1048* (2013.01); *G01R 31/36* (2013.01); *G05F 1/625* (2013.01); *G06F 1/26* (2013.01);
(Continued)

(58) Field of Classification Search
CPC ....... G01R 19/003; G01R 31/36; G01R 31/40; G01R 1/625; G01R 11/1016; G01R 11/1048; G01R 11/3031; G01R 11/3058; G01R 11/3062; G01R 11/3093; G01R 13/126; G01R 1/26; G01R 1/3206; G01R 1/3287; G11C 7/106; G11C 7/1072; H02J 7/0029
See application file for complete search history.

(56) References Cited

U.S. PATENT DOCUMENTS 5,307,488 A * 4/1994 Nakai ........................... 710/260
2009/0138694 A1* 5/2009 Le et al. ........................ 713/2
(Continued)

*Primary Examiner* — Thomas Lee
*Assistant Examiner* — Chad Erdman
(74) *Attorney, Agent, or Firm* — McDermott Will & Emery LLP

(57) ABSTRACT

Aspects of enhanced recovery mechanisms are described. A predetermined operating parameter for a power rail is set at the outset of system start. Afterwards, a processor is released to start with a power management circuit. In turn, the power management circuit receives a default operating parameter for the power rail from the processor, and stores the default operating parameter. The power management circuit also receives a runtime operating parameter for the power rail from the processor and modifies the operating parameter for the power rail according to the runtime operating parameter. If an error condition in the processor is encountered, the power management circuit may modify the operating parameter for the power rail according to the default operating parameter in response to a reset control signal from the processor. Use of the default operating parameter for the power rail may assist the processor to recover from the error condition.

20 Claims, 7 Drawing Sheets

Related U.S. Application Data on Jun. 11, 2013, provisional application No. 61/834,513, filed on Jun. 13, 2013, provisional application No. 61/836,327, filed on Jun. 18, 2013, provisional application No. 61/836,306, filed on Jun. 18, 2013, provisional application No. 61/836,895, filed on Jun. 19, 2013, provisional application No. 61/836,886, filed on Jun. 19, 2013, provisional application No. 61/836,903, filed on Jun. 19, 2013.

(51) Int. Cl.
| | | |
|---|---|---|
| *G06F 13/12* | (2006.01) | |
| *G06F 1/26* | (2006.01) | |
| *G01R 31/36* | (2006.01) | |
| *H02J 7/00* | (2006.01) | |
| *G06F 1/32* | (2006.01) | |
| *G11C 7/10* | (2006.01) | |
| *G06F 11/30* | (2006.01) | |
| *G01R 31/40* | (2014.01) | |
| *G01R 19/00* | (2006.01) | |

(52) U.S. Cl.
CPC .......... *G06F 1/3206* (2013.01); *G06F 1/3287* (2013.01); *G06F 11/1016* (2013.01); *G06F 11/3062* (2013.01); *G06F 11/3093* (2013.01); *G06F 13/126* (2013.01); *G11C 7/106* (2013.01); *G11C 7/1072* (2013.01); *H02J 7/0029* (2013.01); *G01R 19/003* (2013.01); *G01R 31/40* (2013.01); *G06F 11/3031* (2013.01); *G06F 11/3058* (2013.01); *Y02B 60/1282* (2013.01)

(56) References Cited

U.S. PATENT DOCUMENTS

| | | | |
|---|---|---|---|
| 2009/0204835 A1* | 8/2009 | Smith | G06F 1/3287 713/323 |
| 2011/0022826 A1* | 1/2011 | More et al. | 713/1 |
| 2011/0022859 A1* | 1/2011 | More et al. | 713/300 |
| 2012/0117364 A1* | 5/2012 | Rosenquist et al. | 713/2 |
| 2013/0124895 A1* | 5/2013 | Saha | G06F 1/26 713/323 |
| 2013/0254586 A1* | 9/2013 | Winger | G06F 11/0793 714/3 |

\* cited by examiner

ENHANCED RECOVERY MECHANISMS

CROSS-REFERENCE TO RELATED APPLICATIONS

This application claims the benefit of:

U.S. Provisional Application No. 61/759,470, filed Feb. 1, 2013;

U.S. Provisional Application No. 61/833,598, filed Jun. 11, 2013;

U.S. Provisional Application No. 61/834,513, filed Jun. 13, 2013;

U.S. Provisional Application No. 61/836,327, filed Jun. 18, 2013;

U.S. Provisional Application No. 61/836,306, filed Jun. 18, 2013;

U.S. Provisional Application No. 61/836,895, filed Jun. 19, 2013;

U.S. Provisional Application No. 61/836,886, filed Jun. 19, 2013; and

U.S. Provisional Application No. 61/836,903, filed Jun. 19, 2013, the entire contents of each of which are hereby incorporated herein by reference.

This application also makes reference to:

U.S. patent application Ser. No. 13/950,716, titled "Clock Domain Crossing Serial Interface, Direct Latching, and Response Codes" and filed on even date herewith;

U.S. patent application Ser. No. 13/950,725, titled "Power and System Management Information Visibility" and filed on even date herewith;

U.S. patent application Ser. No. 13/950,738, titled "Power Mode Register Reduction and Power Rail Bring Up Enhancement" and filed on even date herewith;

U.S. patent application Ser. No. 13/950,750, titled "Dynamic Power Profiling" and filed on even date herewith;

U.S. patent application Ser. No. 13/950,762, titled "Charger Detection and Optimization Prior to Host Control" and filed on even date herewith; and U.S. patent application Ser. No. 13/950,776, titled "Dynamic Power Mode Switching Per Rail" and filed on even date herewith, the entire contents of each of which are hereby incorporated herein by reference.

BACKGROUND

Battery-powered computing systems and devices have been adopted for use in many aspects of daily life. As these systems and devices are more widely adopted and used in place of other computing systems and devices, they are designed to be more flexible and powerful, but are also more complex.

In some designs, computing systems include several respective processors and subsystems. In certain circumstances, one or more of the processors and subsystems may encounter an error condition which halts or interrupts processing. However, even in this case, other processors, sometimes system status or management processors, continue to operate without error. In this case, the computing system may still be able to perform some tasks. To fully recover, however, it may be necessary to perform a restart or reboot of the entire system. Depending upon the design of the device, disconnection from power might be required. For example, some battery-powered computing systems might require the removal of a battery.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

Figure 1:
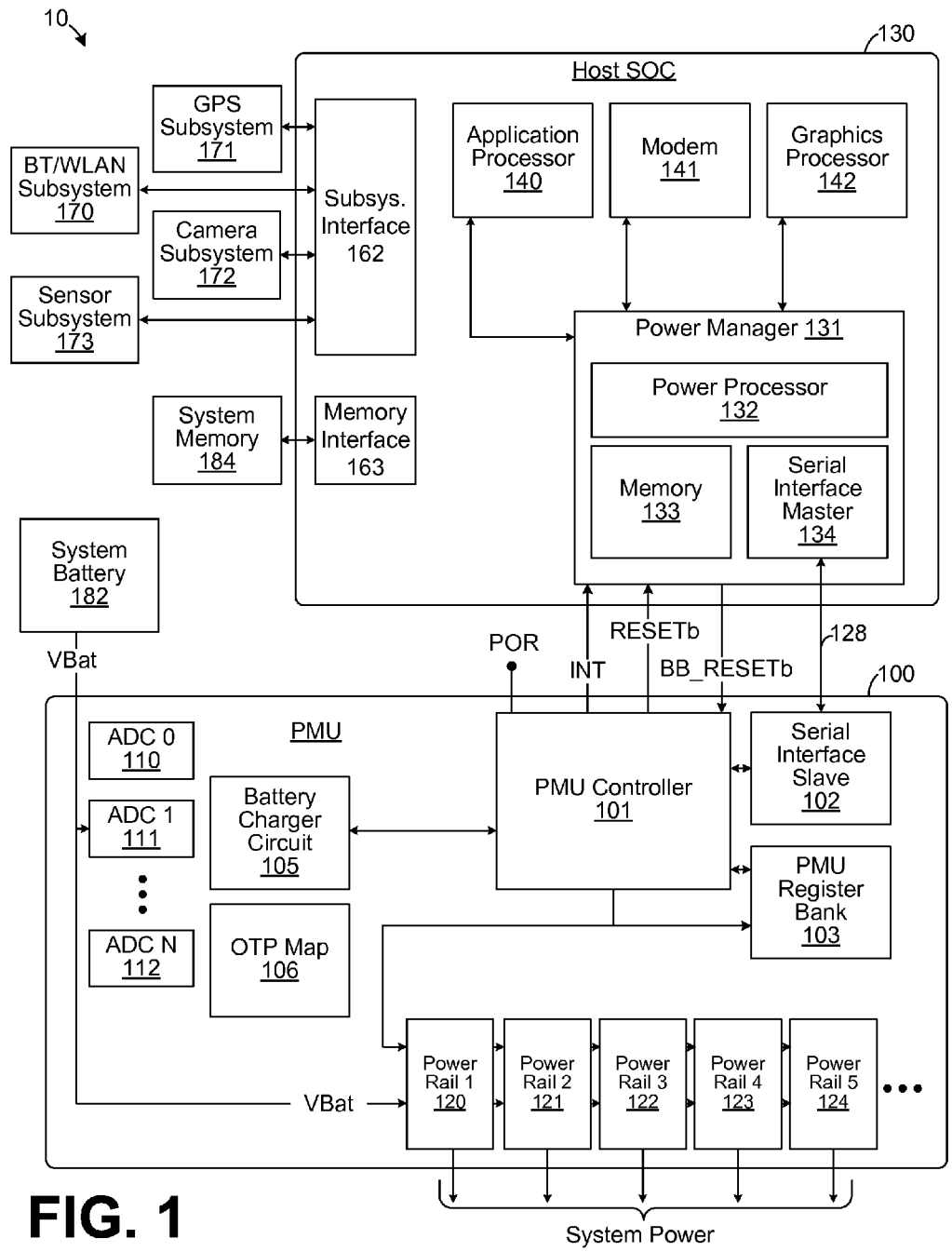
FIG. 1 illustrates a system including enhanced recovery mechanisms according to an example embodiment.

In some designs, computing systems include several respective processors and subsystems. In certain circumstances, one or more of the processors and subsystems may encounter an error condition which halts or interrupts processing. However, even in this case, other processors—sometimes system status or management processors—continue to operate without error. In this case, the computing system may still be able to perform some tasks. To fully recover, however, it may be necessary to perform a restart or reboot of the entire system. Depending upon the design of the device, disconnection from power might be required. Some battery-powered computing systems might require the removal of a battery.

Battery removal might be difficult for some system designs, especially if the battery is fully enclosed within an exterior case of the system without a tool-less means to remove it. In some cases, if a system status or management processor is still operating while an error condition is encountered by another subsystem, the management processor may be able to address the error condition or restart the subsystem without a full system restart.

It is noted that, especially in systems having several power rails for various processors and subsystems that require respective and different output voltages that may vary over time, an erroneous or inadvertent setting on one or more power rails may lead to a system error condition. In such as case, the ability to recover from the error condition may depend, at least in part, upon the modification of the erroneous or inadvertent power rail setting to an appropriate one. Thus, for example, if a power rail for a certain processor has been modified to an output voltage that is too low for stable operation of the processor, the ability for the processor to recover to a stable operating state may depend upon raising the power rail to a suitable higher output voltage.

Further, when attempting to recover from an error condition, the recovery of system parameter data may be helpful to debug the error condition. Various aspects on these concepts are described in further detail below.

In this context, aspects of enhanced recovery mechanisms are described. A predetermined operating parameter for a power rail is set at the outset of system start. Afterwards, a processor is released to start by a power management circuit. In turn, the power management circuit receives a default operating parameter for the power rail from the processor, and stores the default operating parameter. The power management circuit also receives a runtime operating parameter for the power rail from the processor and modifies the operating parameter for the power rail according to the runtime operating parameter. If an error condition in the processor is encountered, the power management circuit may modify the operating parameter for the power rail according to the default operating parameter in response to a reset control signal from the processor. Use of the default operating parameter for the power rail may assist the processor to recover from the error condition.

Turning now to the drawings, an introduction and general description of exemplary embodiments of a system is provided, followed by a description of the operation of the same.

I. System Introduction

FIG. 1 illustrates a system 10 including enhanced recovery mechanisms according to an example embodiment. The system 10 may embody a computing device that includes a number of general and/or specific purpose circuits, processing circuits, processors, registers, memories, sensors, displays, etc. In one embodiment, the system 10 may embody a handheld or portable computing device which is powered from charge stored in a battery. In various embodiments, the system 10 may be embodied as part of a cellular telephone, tablet computing device, laptop computer, or other computing device. Alternatively, because the embodiments described herein are not limited to use in handheld or portable computing devices, the system 10 may be embodied as part of a desktop or set top computing device, for example. Although not illustrated in FIG. 1, it should be appreciated that the system 10 may include one or more displays, microphones, speakers, buttons, indicator lights, haptic feedback elements, memory card readers, etc.

Among other elements, the system 10 includes a power management unit (PMU) 100, a host system-on-chip (SOC) 130, a system battery 182, and a system memory 184. The system 10 also includes certain subsystems such as a bluetooth/wireless local area network (WLAN) subsystem 170, a global positioning system (GPS) subsystem 171, a camera subsystem 172, and a sensor subsystem 173. The subsystems 170-173 are representative subsystems which may be included as elements of the system 10, and other subsystems are within the scope and spirit of the embodiments described herein. It is noted that, just as the host SOC 130 requires power for operation, each of the subsystems 170-173, the system memory 184, and other elements and circuits of the system 10 depend on power for operation. As discussed below, this power may be supplied by and under the control of the PMU 100.

The system battery 182 may be embodied as any rechargeable battery suitable for the application, such as a lithium-ion, nickel-metal-hydride, or other battery variant, without limitation. The system memory 184 may be embodied as a volatile and/or non-volatile random access memory or combination thereof. The system memory 184 may store computer-readable instructions thereon that, when executed by one or more of the processors 140-142 of the host SOC 130, for example, direct the processors 140-142 to execute various aspects of the embodiments described herein.

In general, the PMU 100 controls and/or facilitates control of the distribution of power from the system battery 182 to the elements of the system 10, such as the host SOC 130, the subsystems 170-173, and the system memory 184, for example. As further described below, depending upon the operating state of the system 10 and/or other factors, the PMU 100 may control the distribution of power to one or more elements of the system 10, or the PMU 100 may receive instructions to control the distribution of power to one or more elements of the system 10.

Among other elements, the PMU 100 includes a PMU controller or management circuit 101, a serial interface slave 102, a PMU register bank 103, a battery charger circuit 105, a one time programmable (OTP) map 106, a number 0-N of analog-to-digital (ADC) circuits 110-112, and a number of power rail circuits 120-124. It is noted that FIG. 1 illustrates a representative example of elements of the PMU 100, and it should be appreciated that the PMU 100 may include other elements, such as additional power rails, in various embodiments.

The PMU 100 may set operating parameters for each of the power rails 120-124. For example, among other operating parameters, one or more of the power rails 120-124 may be set to normal, low power, or off modes of operation. Also one or more of the power rails 120-124 may be set to a certain output voltage by the PMU 100. In certain aspects, the PMU 100 may set operating parameters of one or more of the power rails 120-124 according to commands received from the power manager 131 via the serial interface 128.

As illustrated in FIG. 1, in addition to the serial interface 128 between the host SOC 130 and the PMU 100, RESETb, BB_RESETb, and INT control signals are coupled between the host SOC 130 and the PMU 100. Use of the RESETb, BB_RESETb, and INT control signals are described in further below. The PMU controller or power management circuit 101 also relies upon or references a power on or reset signal POR. The power on or reset signal POR may be controlled by a switch actuated by a user, for example.

Among other elements, the host SOC 130 includes general and/or application specific processors. In FIG. 1, the host SOC 130 includes a power manager 131, an application processor 140, a modem 141, and a graphics processor 142. In various embodiments, the host SOC 130 may omit one or more of the processors 140-142 or include processors in addition to the processors 140-142. The host SOC 130 also includes a subsystem interface 162 and memory interface 163. The subsystem interface 162 and the memory interface 163 couple the subsystems 170-173 and the system memory 184 to the host SOC 130 and, particularly, to one or more of the processors 140-142.

The application processor 140 may be embodied as a general purpose processor for executing various applications. For example, the application processor 140 may execute an underlying operating system along with applications such as e-mail, short message service (SMS), telephone, camera, web-browser, and other applications, without limitation. As compared to the PMU 100 and/or the power manager 131, the application processor 140 may consume relatively more power during operation. The modem 141 may include a cellular-based (or similar) communications processor for the communication of data wirelessly in connection with radio-frequency front end circuitry, and the graphics processor 142 may include a processor for driving a display of the system 10.

The power manager 131 includes an power or system power control processor 132, a memory 133, and a serial interface master 134. The power processor 132 may be embodied as a relatively small and low power processor or processing circuit for interfacing with the PMU 100 via a serial interface 128. In one embodiment, the serial interface master 134 of the power manager 131 controls the serial interface 128, although the PMU 100 may control the serial interface 128 in other embodiments. The memory 133 stores computer-readable instructions for execution by the power processor 132.

II. System Operation

With reference to the elements of the system 10 introduced above, aspects of the operation of the system 10 are described below.

A. PMU Operation

The PMU 100 may be designed, adapted, and configured to perform operations that support the host SOC 130, the subsystems 170-173, the system memory 184, and other elements of the system 10. The PMU 100 may gather system parameters for the system 10, such as power and management system status data (i.e., "system parameters," "system status data", etc.), in various modes of operation.

The PMU controller or management circuit 101 generally coordinates and controls the operations of the PMU 100. The PMU controller 101 may be embodied as a general or specific purpose circuit, processing circuit, processor, state machine, etc. The PMU controller 101 interfaces with the battery charger circuit 105 to charge the system battery 182 when power for charging is available, interfaces with the serial interface slave 102 to communicate with the host SOC 130 over the serial interface 128, interfaces with the power rail circuits 120-124 to control power to the system 10, and interfaces with the PMU register bank 103 to store and access data associated with the status of the PMU 100 and the system 10. Additionally, the PMU controller 101 interfaces with other elements of the PMU 100, such as the ADCs 110-112 and the OTP map 106.

In one aspect, the PMU register bank 103 may include operating registers for the power rails 120-124. By accessing the operating registers, operating parameters (e.g., output voltage, mode, etc.) for the power rails 120-124 may be set by the PMU 100. Also, the operating parameters may be set by the power manager 131 of the host SOC 130 by sending commands to the PMU 100 over the serial interface 128. Generally, the operating registers include bit entries to set the operating mode (e.g., normal, low power, etc.) of the power rails 120-124, bit entries to set output voltage levels of the power rails 120-124, and/or bit entries for other operating settings of the power rails 120-124. It is noted, however, that the operation of the power rails 120-124, individually, may differ from rail to rail. For example, certain power rails may be fixed to a certain output voltage or have limited operating modes (e.g., on/off).

The serial interface slave 102 comprises one end of the serial interface 128 that facilitates communication between the PMU 100 and the host SOC 130. Among various modes and states of operation of the system 10, the serial interface 128 is relied upon to communicate system parameters or system status data between the PMU 100 and the host SOC 130.

The OTP map 106 includes an array of programmable fuses or similar circuit elements that may each be programmed to retain a logical value. In this context, the OTP map 106 may be programmed during an initial test of the PMU 100 after manufacture, for example, or at another suitable time. The logical values retained in the OTP map 106 may be referenced by the PMU controller 101, to direct conditional operations of the PMU controller 101 and set initial settings for the PMU 100. For example, the logical values retained in the OTP map 106 may be relied upon to store initial voltage settings, for example, for one or more of the power rail circuits 120-124.

Depending upon the operating status of the system 10, the PMU controller 101 may directly set the voltage and/or current settings for one or more of the power rails 120-124 based on the logical values retained in the OTP map 106, for example, and/or other factors. Additionally or alternatively, depending upon the operating status of the system 10, as described herein, the PMU controller 101 may set voltage settings, current settings, and/or power operating modes for one or more of the power rails 120-124 based on commands received from the host SOC 130 via the serial interface 128, as further described below.

In other aspects of operation, the a PMU controller or management circuit 101 may set an initial operating parameter for one or more of the power rails 120-124 at the outset of operation. After setting the initial operating parameter, the PMU controller 101 releases the power manager 131 and/or other processors of the host SOC 130 to start. In turn, the PMU controller 101 receives a default operating parameter for the one or more of the power rails 120-124 from the power management processor 131 and stores the default operating parameter. Further, the PMU controller receives runtime operating parameters for the one or more of the power rails 120-124 and modifies the operating parameters for the one or more of the power rails 120-124 according to the runtime operating parameters.

At some time, one or more of the processors 140-142 of the host SOC 130 and/or the subsystems 170-173 may encounter an error condition. In this case, the power manager 131 may assert the BB_RESETb control signal to the PMU 100, to transition the one or more power rails of the PMU 100 from the runtime operating parameters to the default operating parameters. The transition may assist the host SOC 130 and/or the subsystems 170-173 to recover from the error condition. Further aspects of error recovery mechanisms are described below.

B. Host SOC Operation

The host SOC 130 may be generally embodied as a full system-on-chip semiconductor device. In this sense, the host SOC 130 integrates various general and/or application specific processors and processing circuits into a single integrated circuit package, reducing space. Overall, the power manager 131 of the host SOC 130 supports the host SOC 130 and the power requirements of the host SOC 130.

The power manager 131 of the host SOC 130 may retrieve and evaluate the power and management system status data stored in the PMU 100, while coordinating a power up sequence for the host SOC 130 and/or the subsystems 170-173 with the PMU 100. As described in further detail below, the power processor 132 of the power manager 131 and the PMU 100 may operate in connection with each other to power up elements in the system 10. On the basis of system status data received from the PMU 100, for example, the power processor 132 and the PMU 100 may conditionally power up elements in the system 10 in various sequences or modes of operation.

In the context of power up of the host SOC 130, it is noted that each of the power manager 131, the application processor 140, the modem 141, and the graphics processor 142 may be powered by one of the power rails 120-124 of the PMU 100. Each of these power rails may be electrically coupled from the PMU 100 to the host SOC 130 by one or more respective power traces in the system 10 and power pins or pads of the PMU 100 and the host SOC 130. Other power rails of the PMU 100 are respectively coupled to system elements in the system 10, as necessary, for supplying power. According to certain aspects described herein, because the power manager 131 of the host SOC 130 operates as a type of partner with the PMU 100 for power management in the system 10, the PMU 100 generally powers and releases the power manager 131 to start while the remaining processors and systems of the host SOC 130 and/or the system 10 are left without power until a later time.

In other aspects, the power manager 131 may detect one or more error conditions in the host SOC 130 and/or the subsystems 170-173. In this case, as one means to address the error condition, the power manager 131 may assert the BB_RESETb signal to transition one or more of the power rails 120-124 of the PMU 100 into a default state. Transitioning the one or more power rails 120-124 to a known state may assist the system 10 to recover from the error condition, as described herein. In other aspects, the power manager 131 may respond to one or more interrupts received from the PMU 100, and the PMU 100 may gather system parameter data stored in the memory 122 and communicate the system parameter data to the PMU 100 for debug or similar purposes.

Figure 2A:
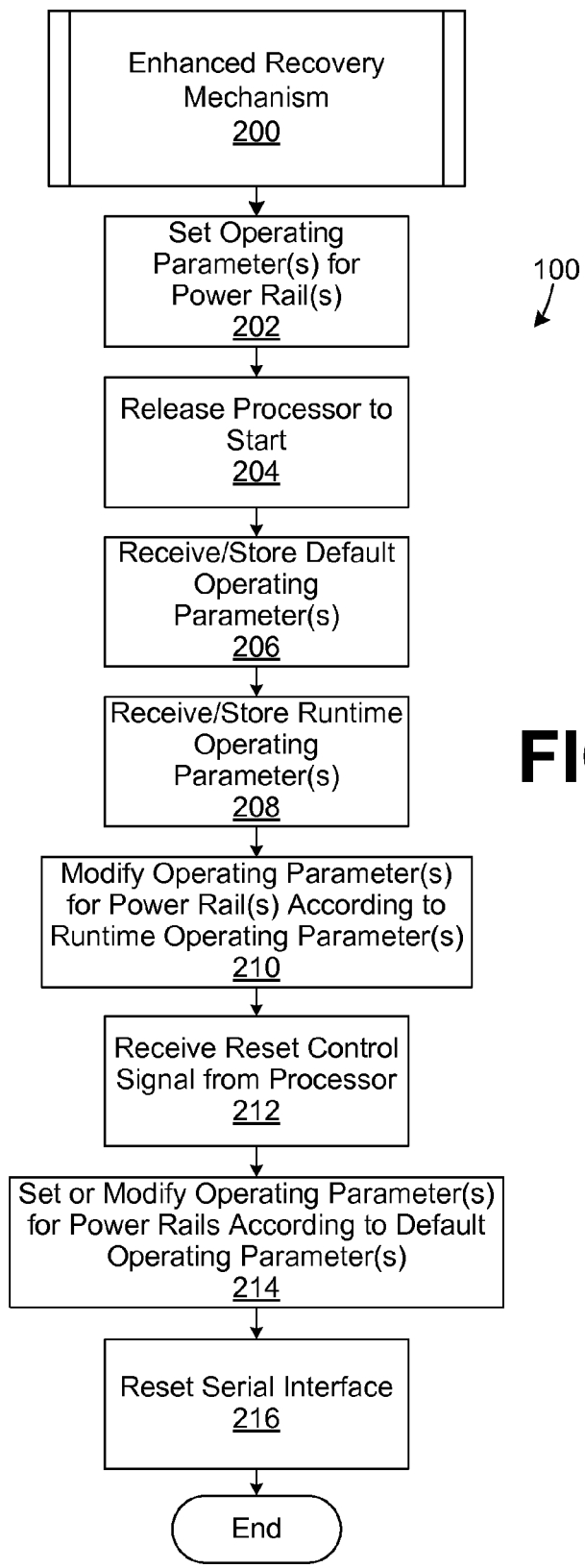
FIG. 2A illustrates a process flow diagram for a process of enhanced recovery performed by the system of FIG. 1 according to an example embodiment.
Figure 2B:
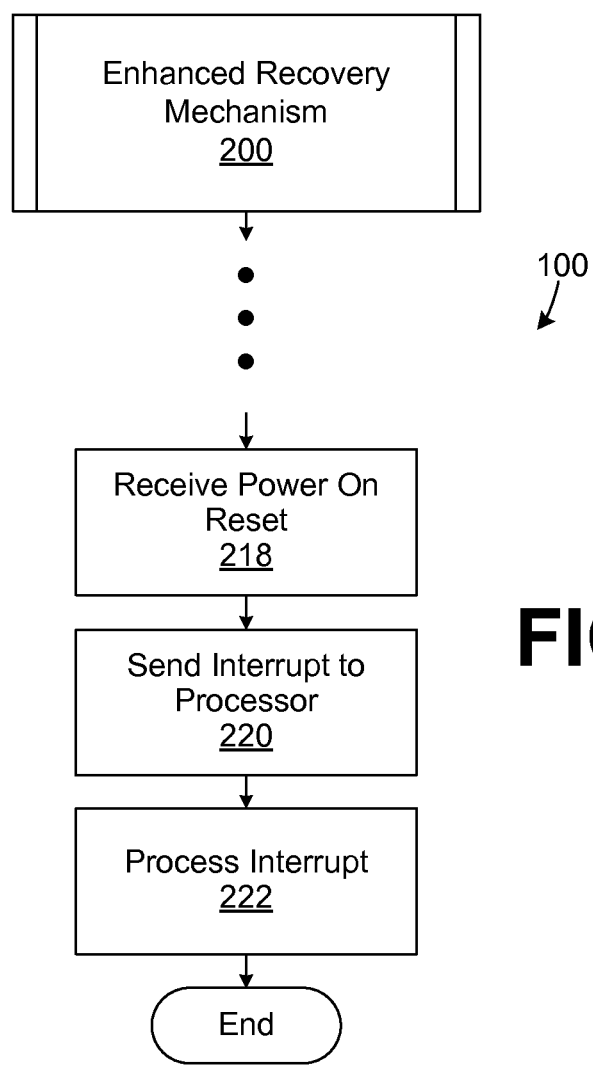
FIG. 2B illustrates a process flow diagram including additional aspects of the process of enhanced recovery performed by the system of FIG. 1 according to another example embodiment.
Figure 2C:
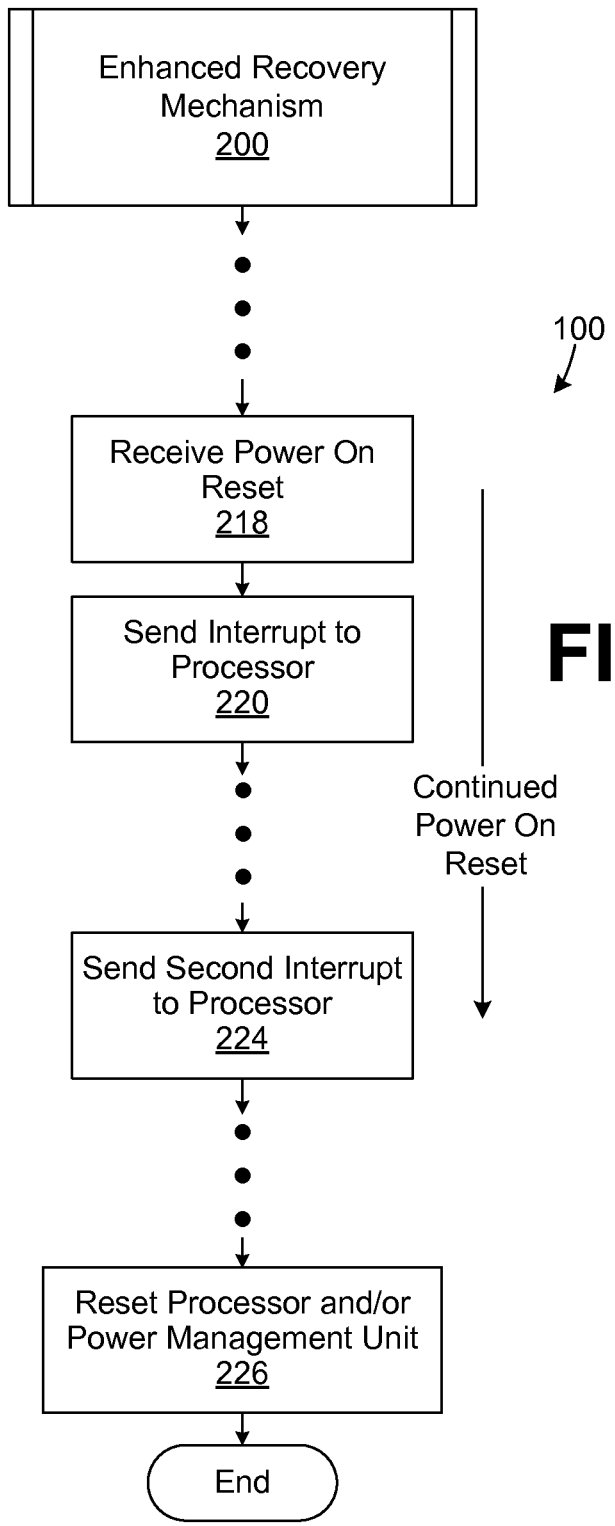
FIG. 2C illustrates a process flow diagram including additional aspects of the process of enhanced recovery performed by the system of FIG. 1 according to still another example embodiment.

Turning to FIGS. 2A-2C, process flow diagrams illustrating example processes performed by a system for enhanced recovery mechanisms are provided. While the process flow diagrams are described in connection with the system 10 and PMU 100 of FIG. 1, it is noted that other systems and/or power management units or circuits may perform the illustrated processes. That is, in various embodiments, systems similar to the system 10 and the PMU 100 may perform the processes illustrated in FIGS. 2A-2C.

In certain aspects, the flowcharts of FIGS. 2A-2C may be considered to depict example steps performed by the PMU 100 of the system 10 according to one or more embodiments. Although the process diagrams of FIGS. 2A-2C illustrate an order, it is understood that the order may differ from that which is depicted. For example, an order of two or more elements in the process may be scrambled relative to that shown, performed concurrently, or performed with partial concurrence. Further, in some embodiments, one or more of the elements may be skipped or omitted within the scope and spirit of the embodiments described herein.

In the description below, FIGS. 3A-3D are also referenced in connection with the process flow diagrams of FIGS. 2A-2C. It is noted that the timing diagrams of FIGS. 3A-3D are provided by way of example only and are not intended to limit the embodiments described to the timings illustrated. Further, not every aspect of the timing diagrams are drawn to scale in time, and variations in timing are within the scope and spirit of the embodiments.

FIG. 2A illustrates a process flow diagram for a process 200 of enhanced recovery performed by the PMU 100 of the system 10 of FIG. 1 according to an example embodiment. At reference numeral 202, the process 200 includes setting an operating parameter for a power rail. In various embodiments, reference numeral 202 may include setting one or more operating parameters for one or more of the power rails 120-124. More particularly, upon initial power up, the PMU controller 101 sets one or more operating parameters for one or more of the power rails 120-124 based on predetermined programmed settings in the OTP map 106. As noted above, each of the power rails 120-124 may include an operating register in the register bank 103 (FIG. 1), and operating parameters (i.e., output voltage, mode, etc.) for any one of the power rails 120-124 may be set or modified, as described herein, by writing logic values to the corresponding operating registers of the power rails 120-124. In one embodiment, only those power rails necessary to boot or start the power manager 131 and/or the application processor 140 of the host SOC 130 are powered up based on the predetermined programmed settings stored in the OTP map 106.

Figure 3A:
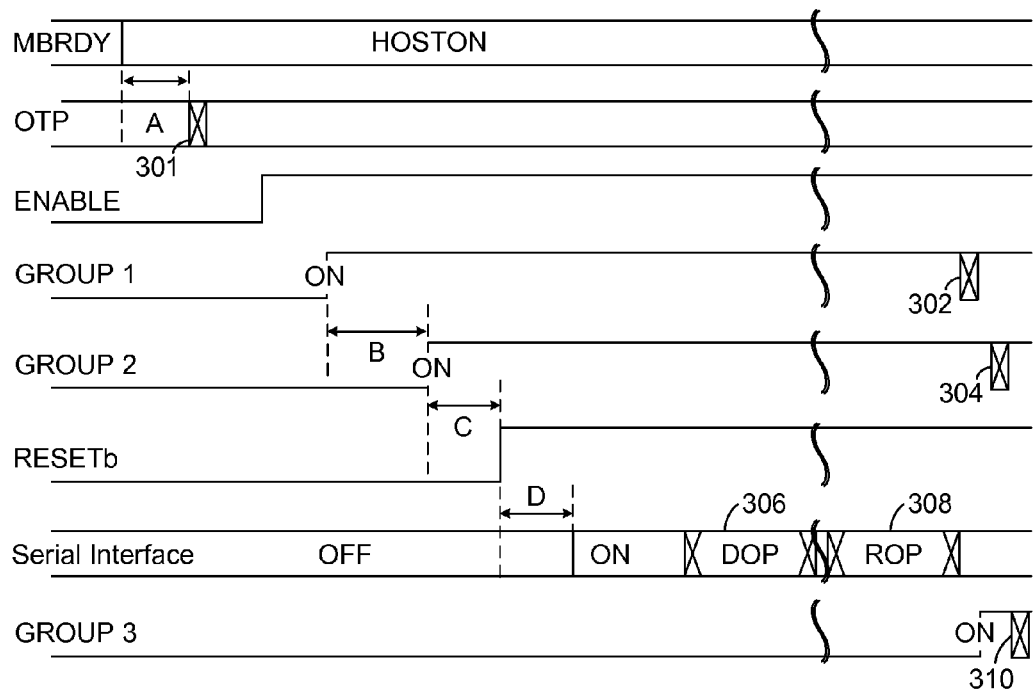
FIG. 3A illustrates a timing diagram for aspects of enhanced recovery mechanisms in the system of FIG. 1 according to an example embodiment.

Referring to FIG. 3A for an additional reference, an example timing diagram for aspects of enhanced recovery mechanisms in the system 10 of FIG. 1 is illustrated. In FIG. 3A, main battery ready MBRDY and HOSTON operating states of the PMU 100 are illustrated. In general, the PMU 100 (and the PMU controller 101) enters the HOSTON state based on a trigger such as pressing a power on key or a battery charger is plugged in, for example, and once sufficient battery charge is available in the system battery 182 (FIG. 1) to support the operation of digital circuitry in the PMU controller 101. At reference numeral 202 of FIG. 2A, upon entering the HOSTON state, the PMU controller 101 sets or writes operating parameter data from the OTP map 106 (FIG. 1) into one or more operating registers in the register bank 103 (FIG. 1) for one or more of the power rails 120-124 at 301 (FIG. 3A), after the time period "A".

After some wait time, the PMU controller 101 enables one or more of the power rails. According to certain aspects, after being enabled as illustrated in FIG. 3A, groups (e.g., GROUP 1 and GROUP 2) of one or more power rails are powered up by the PMU controller 101 in a staggered fashion over time. The power rails may be powered up in the staggered fashion to avoid current spikes, etc. For example, one or more power rails in Group 1 may be powered up first, followed by other power rails in Group 2 after the time period "B". Although two groups of power rails are illustrated in FIG. 3A, it should be appreciated that more or less than two groups of power rails may be powered up in various embodiments.

At reference numeral 204 of FIG. 2A, the process 200 includes releasing a processor to start. For example, with reference to the timing diagram of FIG. 3A, after the one or more power rails are enabled, the PMU controller 101 releases one or more processors within the host SOC 130 to start after the time period "C". In one embodiment, the power manager 131 of the host SOC 130 may be released for power up by releasing the RESETb control signal from the PMU 100 to the host SOC 130, as illustrated in the timing diagram of FIG. 3A. The power manager 131 may be released by the PMU 100 when the PMU controller 101 transitions the RESETb control signal from logic low to logic high.

At some time "D" after the power manager 131 starts, the serial interface 128 (FIG. 1) between the PMU 100 and the host SOC 130 is released or turned on by the power manager 131. Afterwards, at reference numeral 206 of FIG. 2A, the process 200 includes receiving a default operating parameter for a power rail. More particularly, with reference to FIG. 3A, the PMU controller 101 receives one or more default operating parameters (DOP) 306 from the power manager 131 via the serial interface 128 (FIG. 1). At reference numeral 206, the process 200 also includes storing the default operating parameter. The one or more default operating parameters may be stored by the PMU controller 101 in the register bank 103, for later reference. It is noted that, in another aspect of the system 10, one or more of the wait times or timings "A"-"D" may be configured and/or predetermined by the PMU 100, for example, according to a programmed setting in the OTP map 106.

As compared to the predetermined programmed operating parameters stored in the OTP map 106, which include initial operating settings for one or more power rails, the one or more default operating parameters may be relied upon by the PMU 100 and the system 10, in part, to recover from (or attempt to recover from) an error condition. As described above, recovery from the error condition may require setting one or more power rails back to a default operating setting. Thus, the default operating settings received by the PMU 100 at reference numeral 208 may be stored for later reference, in case of an error condition at a later time. Upon the error condition, the power manager 131 may assert the BB_RESETb control signal to the PMU 100, as described in further detail below.

At reference numeral 208 of FIG. 2A, the process 200 includes receiving and storing one or more runtime operating parameters. In FIG. 3A, the runtime operating parameters (ROP) 308 are received from the power manager 131 at some time after the default operating parameters. The runtime operating parameters may be stored in the register bank 103 of the PMU 100. As compared to the predetermined programmed operating parameters and the default operating parameters, the runtime operating parameters may be relied upon to modify and/or set runtime operating conditions for one or more of the power rails 120-124. In other words, the runtime operating parameters may include the voltage, mode settings, etc. for one or more of the power rails 120-124 of the PMU 100, as required by the processors and/or subsystems of the system 10 during various runtime operations. In this context, it should be appreciated that the runtime operating parameters 308 may be received by the PMU 100 from the power manager 131, from time to time, as necessary depending upon the state of the system 10.

At reference numeral 210 of FIG. 2A, the process 200 includes modifying and/or setting an operating parameter for a power rail according to the one or more runtime operating parameters received at reference numeral 208. Here, runtime operating parameters may be set for one or more of the power rails 120-124. That is, based on the runtime operating parameters received at reference numeral 208, the PMU controller 101 may set or modify operating parameters for one or more of the power rails 120-124 according to the runtime operating parameters received at reference numeral 208. Again, each of the power rails 120-124 may include an operating register in the register bank 103 (FIG. 1), and runtime operating parameters (i.e., output voltage, mode, etc.) for any one of the power rails 120-124 may be set or modified for runtime operation by the PMU controller 101 writing runtime logic values to the corresponding operating registers of the power rails 120-124.

As illustrated in FIG. 3A, modifying and/or setting runtime operating parameters at reference numeral 210 of FIG. 2A may lead to transitions in voltage, mode, etc. on various power rails or groups of power rails (e.g., Group 1, Group 2, and Group 3), as noted at references 302, 304, and 310 of FIG. 3A. These transitions may occur at the same time or be staggered over time. Further, these transitions may continue to occur as runtime operating parameters change over time. Further, as illustrated for the GROUP 3 power rail or rails in FIG. 3A, the transition may include both turning a power rail on and transitioning the power rail to a certain mode and/or voltage.

So long as the system 10 operates without any error conditions, operations of the host SOC 130 and the PMU 100 may continue. On the other hand, if an error condition is encountered by a processor or subsystem of the system 10, the error condition may be identified by the power manager 131. For example, if the BT/WLAN subsystem 170, the modem 141, or the application processor 140 encounters an error condition, the power manager 131 may identify the condition based on a data queue backup, an abnormal power profile of the BT/WLAN subsystem 170, the modem 141, or the application processor 140, or other conditions. In this case, the power manager 131 may identify that, to recover from the error condition, one or more power rails in the system 10 should be transitioned to a default operating parameter or value. As another example, if communications via the serial interface 128 between the host SOC 130 and the PMU 100 stall, the power manager 131 may identify that the serial interface slave 102 should be transitioned or reset to a default operating parameter or value.

Figure 3B:
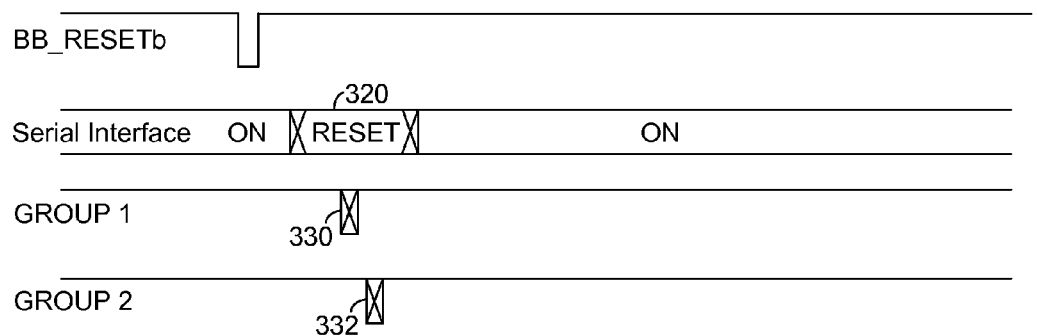
FIG. 3B illustrates a timing diagram for other aspects of enhanced recovery mechanisms in the system of FIG. 1 according to another example embodiment.

In the context of addressing an error condition, at reference numeral 212, the process 200 includes receiving a reset signal. Here, the reset signal may be received by the PMU 100 from the power manager 131 of the host SOC 130 via the BB_RESETb control signal. With reference to FIG. 3B for an example, the power manager 131 may drive the BB_RESETb control signal to a logic low value for a limited period of time, to direct the PMU 100 to transition certain operations in an effort to recover from or address the error condition. Such a transition in operations of the PMU 100 may include one or more operational changes.

For example, at reference numeral 214 of FIG. 2A, the transition in operations of the PMU 100 may include setting or modifying one or more operating parameters for one or more power rails according to the default operating parameters received at reference numeral 206. Examples of these transitions are illustrated in FIG. 3B at references 330 and 332 for the GROUP 1 and GROUP 2 power rail or rails, and may include a transition in voltage and/or mode of the power rails. Here, it is noted that, in exemplary embodiments, the transition does not include a "reset" or "power down" of the power rails which are transitioned. In other words, if a power rail is transitioned from a runtime operating voltage of 2.2V to a default operating voltage of 2.4V, then the power rail does not fall to a potential of 0V when transitioning from 2.2V and 2.4V. Instead, the transition proceeds from 2.2V to 2.4V without falling to a potential of 0V. In this manner, if the transitioned power rail provides power to certain memory elements, power is continuously provided to avoid data loss, for example. Further, if a power rail is transitioned from a runtime low power (i.e., low current) operating mode at 2.2V to a default normal (i.e., nominal current) operating mode at 2.2V, the output voltage of the power rail does not change during the transition.

Additionally or alternatively, at reference numeral 216 of FIG. 2A, operational settings of the serial interface slave 102 may be reset. In this case, status registers, etc. of the serial interface slave 102 may be cleared, and the serial interface 128 may generally be reset for communications as illustrated at reference numeral 320 of FIG. 3B.

Depending upon the error condition, the system 10 may be able to recover after the transitions in operations performed by the PMU 100 at references 214 and/or 216 of FIG. 2A. Generally, the reset or transition of at least certain ones of the power rails 120-124 in the system 10 of FIG. 1 and the reset of the serial interface slave 102 of the PMU 100 may be sufficient in certain circumstances to address one or more error conditions encountered by the system 10.

In some situations, however, the host SOC 130, one or more of the processors 140-142 in the host SOC 130, or one or more of the subsystems 170-173 may be unresponsive and/or halted despite the transitions by the PMU 100 at reference numerals 214 and/or 216. In some cases, this lack of responsiveness despite the transitions by the PMU 100 at reference numerals 214 and/or 216 may be identified by a user and not, for example, by the power manager 131. In other words, the power manager 131 may not be able to identify every error condition of the system 10 which results in unresponsive behavior. In this context, the process 200 may further include the processes described below with reference to FIGS. 2B and/or 2C, which rely in part upon external inputs to the system 10.

In FIG. 2B, at reference numeral 218, the process 200 includes receiving a power on key or reset press from a user. In one embodiment, an indication of the power on key or reset press may be received in connection with the POR indicator 340 illustrated in FIG. 1. It should be appreciated that the power on key or reset press may be associated with a switch actuated by a user, for example, but need not be limited to any particular switch. Instead, any user input may be relied upon to develop the POR indicator 340. The development of the POR indicator 340, according to user action, may be in response to the user's identification of an error condition in the system 10, such as an unresponsive display screen, for example, or other condition. Here, although not illustrated in FIG. 3C, the receipt of the power on key or reset press may occur after the timing aspects illustrated in FIGS. 3A and 3B.

Figure 3C:
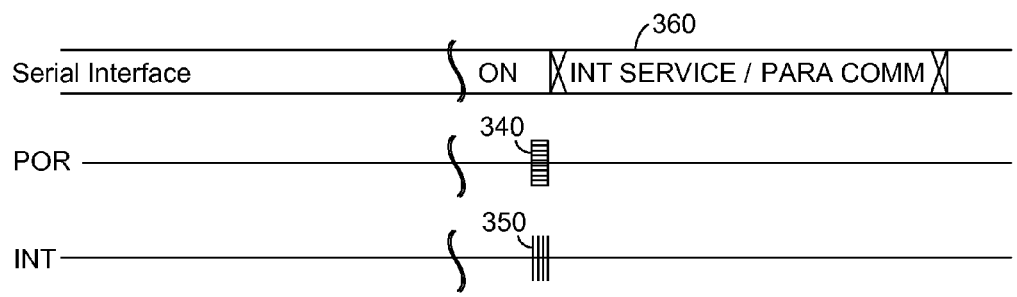
FIG. 3C illustrates a timing diagram for other aspects of enhanced recovery mechanisms in the system of FIG. 1 according to another example embodiment.

At reference numeral 220 of FIG. 2B, the process 200 includes sending an interrupt 350 to a processor. For example, the interrupt 350 may be sent from the PMU 100 to the power manager 131 and/or the application processor 140 of the host SOC 130. With reference to FIG. 3C, the interrupt 350 may occur at a timing that coincides with the receipt of the POR indicator 340. In general, the interrupt 350 may be communicated from the PMU 100 to the power manager 131 via the INT control signal (FIG. 1). In one embodiment, the INT control signal may indicate only an interrupt, and the power manager 131 may need to communicate with the PMU 100 via the serial interface 128 to identify the specifics (e.g., reason) for the interrupt 350. In one embodiment, the PMU 100 may indicate that the reason for the interrupt 350 sent at reference numeral 220 includes an impending transition, restart, reset, or other attempt to recover from some error condition of the system 10.

At reference numeral 222, the process 200 includes processing the interrupt 350. For example, in FIG. 3C, the processing may be performed at reference numeral 360 and may include servicing the interrupt 350 and, in some embodiments, communicating system status parameter data from the host SOC 130 to the PMU 100. Generally, if the power manager 131 of the host SOC 130 is in a condition to respond to the interrupt 350, the power manager 131 will communicate with the PMU 100 to service the interrupt 350. Servicing the interrupt 350 may include communicating state, power, or other system status information of the host SOC 130, which may be stored in the memory 133 (FIG. 1), to the PMU 100. In certain aspects, even if the system 10 has encountered an unrecoverable error condition, if the power manager 131 can respond to the interrupt, the system status information may be useful for debugging, etc. Additionally or alternatively, the PMU 100 may be able to evaluate the manner in which the power manager 131 processes the interrupt 350 and make any changes which are deemed likely to assist the system 10 to recover from an error condition.

Figure 3D:
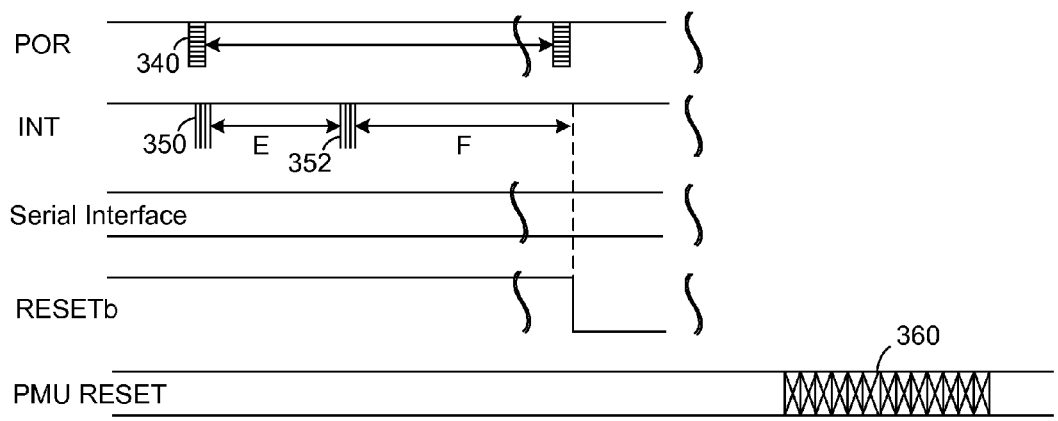
FIG. 3D illustrates a timing diagram for other aspects of enhanced recovery mechanisms in the system of FIG. 1 according to still another example embodiment.

In cases in which the error condition has, for example, completely halted the operation of the host SOC 130 and/or the power manager 131, the process 200 may include the additional processes illustrated in FIG. 2C. In FIG. 2C, processes at reference numerals 218 and 220 are similar to those of FIG. 2B. However, instead of the power manager 131 processing the interrupt 350 sent by the PMU 100 to the power manager 131 at reference numeral 220, the power manager 131 fails to respond to the interrupt 350. In this case, in one embodiment, when the POR indicator 340 remains or continues to be asserted for a predetermined time period after the interrupt 350 is sent, and without response from the power manager 131, the process 200 includes sending a second interrupt 352 from the PMU 100 to the power manager 131 at reference numeral 224. As illustrated in FIG. 3D, for example, the second interrupt 352 may be sent from the PMU 100 to the power manager 131 at a predetermined time "E" after the first interrupt 350 is sent, the POR indicator 340 continues to be asserted, and the power manager 131 fails to respond to the interrupt 350 (i.e., no activity on the serial interface).

Further, at reference numeral 226 of FIG. 2C, when a response to the second interrupt 352 is not received while the POR indicator 340 continues for a second predetermined time "F", the process 200 may further include resetting the host SOC 130. For example, as illustrated in FIG. 3D, if the PMU 100 does not receive a response to the second interrupt 352 (i.e., no activity on the serial interface) for the second predetermined time "F" after the first interrupt 352 is sent, then the process includes 226 resetting the host SOC 130. In this context, the PMU 100 may reset the host SOC 130 by driving the RESETb logic signal to logic low, as illustrated in FIG. 3D.

It is noted that the PMU 100 may attempt to interrupt the host SOC 130 more than two times before resetting the host SOC 130. In various embodiments, the PMU 100 may attempt to interrupt the host SOC 130 three or more times, in an effort to determine whether operations of the host SOC 130 stabilize and become responsive.

In other aspects and embodiments, at reference numeral 226, the process 200 may further include resetting the PMU 100. For example, at reference 360 of FIG. 3D, the PMU 100 may reset itself if the POR indicator 340 continues to be asserted (and/or based on other conditions) while no response is identified from the host SOC 130 by the PMU 100 even after the RESETb logic signal is asserted. Thus, in addition to the PMU 100 resetting the host SOC 130 via the RESETb logic signal, the PMU 100 may reset itself at reference numeral 226 of the process 200 in an effort to regain control over operation of the system 10. Particularly, if the host SOC 130 does not respond to a reset of the host SOC 130 by driving the RESETb signal to logic low, as illustrated in FIG. 3D, the PMU 100 may conduct an internal reset at 360. This internal reset of the PMU 100 may include one or more of powering down the power rails 120-124 in a suitable order, following an internal power down sequence for the internal elements of the PMU 100, and setting an internal timer for restart of the PMU 100, for example. In this sense, the entire system 10 may be restarted. This restart of the system 10 may be similar, in effect, to removal or electrical disconnection of the system battery 182 from the system 10.

According to aspects of the embodiments described herein, various enhanced recovery mechanisms are described to assist the system 10 with recovery in case of an error condition. It is noted that the use of default operating parameters, transitions of power rails, resets of interfaces, interrupts, etc., as described herein, may be relied upon in various combinations in addition to those provided in the example embodiments.

With regard to structural aspects of the system 10, in various embodiments, each of the PMU controller 101, the power processor 131, and or other processors or processing circuits of the system 10 may comprise general purpose arithmetic processors, state machines, or Application Specific Integrated Circuits ("ASICs"), for example. Each such processor or processing circuit may be configured to execute one or more computer-readable software instruction modules. In certain embodiments, each processor or processing circuit may comprise a state machine or ASIC, and the processes described in FIGS. 2A-2C may be implemented or executed by the state machine or ASIC according to the computer-readable instructions.

The memories and/or registers described herein may comprise any suitable memory devices that store computer-readable instructions to be executed by processors or processing circuits. These memories and/or registers store computer-readable instructions thereon that, when executed by the processors or processing circuits, direct the processors or processing circuits to execute various aspects of the embodiments described herein.

As a non-limiting example group, the memories and/or registers may include one or more of an optical disc, a magnetic disc, a semiconductor memory (i.e., a semiconductor, floating gate, or similar flash based memory), a magnetic tape memory, a removable memory, combinations thereof, or any other known memory means for storing computer-readable instructions.

In certain aspects, the processors or processing circuits are configured to retrieve computer-readable instructions and/or data stored on the memories and/or registers for execution. The processors or processing circuits are further configured to execute the computer-readable instructions to implement various aspects and features of the embodiments described herein.

Although embodiments have been described herein in detail, the descriptions are by way of example. The features of the embodiments described herein are representative and, in alternative embodiments, certain features and elements may be added or omitted. Additionally, modifications to aspects of the embodiments described herein may be made by those skilled in the art without departing from the spirit and scope of the present invention defined in the following claims, the scope of which are to be accorded the broadest interpretation so as to encompass modifications and equivalent structures.

The invention claimed is:

1. A method, comprising:
   setting an operating parameter for a power rail, wherein the operating parameter comprises a power value;
   releasing, with a power management circuit, a processor to start;
   storing a default operating parameter for the power rail, wherein the default operating parameter comprises a default power value;
   receiving a runtime operating parameter for the power rail and modifying the operating parameter for the power rail according to the runtime operating parameter, wherein the runtime operating parameter comprises a runtime power value; and
   in response to a reset control signal from the processor, transitioning the operating parameter for the power rail from the runtime operating parameter to the default operating parameter, wherein the transitioning comprises transitioning the power value for the power rail from the runtime power value to the default power value, and wherein the power value for the power rail is maintained at a value greater than zero throughout the transition.

2. The method according to claim 1, wherein setting the operating parameter for the power rail comprises setting a predetermined programmed setting for the power rail.

3. The method according to claim 1, wherein storing the default operating parameter comprises storing a plurality of default operating parameters.

4. The method according to claim 3, wherein transitioning the operating parameter for the power rail comprises modifying a plurality of power rails according to the plurality of default operating parameters.

5. The method according to claim 1, further comprising, in response to the reset control signal from the processor, resetting a serial interface between the power management circuit and the processor.

6. The method according to claim 1, further comprising:
   sending an interrupt to the processor based upon a power on key press; and
   when a response to the interrupt is not received while the power on key press continues for a predetermined time, sending a second interrupt to the processor.

7. The method according to claim 6, further comprising, when a response to the interrupt is received, communicating with the processor to receive system status parameter data.

8. The method according to claim 6, further comprising, when a response to the second interrupt is not received while the power on key press continues for a second predetermined time, resetting at least one of the processor or the power management circuit.

9. A system, comprising:
   a processor; and
   a power management circuit configured to:
      set an operating parameter for a first power rail;
      release the processor to start;
      receive a default operating parameter for the first power rail from the processor and store the default operating parameter;
      receive a respective runtime operating parameter for each of the first power rail and a plurality of second power rails;
      modify the operating parameter for the first power rail according to the respective runtime operating parameter;
      set operating parameters for each of the plurality of second power rails according to the respective runtime operating parameter; and
      in response to a reset control signal from the processor, transition a power value for the first power rail from the respective runtime operating parameter for the first power rail to the default operating parameter for the first power rail, wherein the power value for the first power rail is maintained at a value greater than zero throughout the transition.

10. The system according to claim 9, wherein the power management circuit is further configured to:
    send an interrupt to the processor based upon a power on key press; and
    send a second interrupt to the processor when a response to the interrupt is not received while the power on key press continues for a predetermined time.

11. The system according to claim 10, wherein the power management circuit is further configured to:
    communicate with the processor to receive system status parameter data when a response to the interrupt is received; and reset at least one of the processor or the power management circuit when a response to the second interrupt is not received while the power on key press continues for a second predetermined time.

12. A method, comprising:
releasing, with a power management circuit, a processor to start;
receiving and storing a default operating parameter for a power rail from the processor, the default operating parameter comprising a default power value;
receiving a runtime operating parameter for the power rail and modifying an operating parameter for the power rail according to the runtime operating parameter, the runtime operating parameter comprising a runtime power value; and
in response to a reset control signal from the processor, transitioning the operating parameter for the power rail from the runtime operating parameter to the default operating parameter, wherein the transitioning comprises transitioning a power value for the power rail from the runtime power value to the default power value, and wherein the power value for the power rail is maintained at a value greater than zero throughout the transition.

13. The method according to claim 12, wherein storing the default operating parameter comprises storing a plurality of default operating parameters.

14. The method according to claim 13, wherein transitioning the operating parameter for the power rail comprises transitioning a plurality of power rails according to the plurality of default operating parameters.

15. The method according to claim 12, further comprising, in response to the reset control signal from the processor, resetting a serial interface between the power management circuit and the processor.

16. The method according to claim 12, further comprising:
sending an interrupt to the processor based upon a power on key press; and
when a response to the interrupt is not received while the power on key press continues for a predetermined time, sending a second interrupt to the processor.

17. The method according to claim 16, further comprising, when a response to the second interrupt is not received while the power on key press continues for a second predetermined time, resetting at least one of the processor or the power management circuit.

18. The method of claim 1, wherein setting the operating parameter comprises writing data to an operating register associated with the power rail, the data including a power mode bit entry.

19. The system of claim 9, wherein:
the processor is further configured to:
detect an error condition associated with at least one component of the system;
determine at least one power rail among the first power rail or the plurality of second power rails that is associated with the at least one component; and
generate a control signal to cause transition of the determined at least one power rail from the respective runtime operating parameter for the at least one power rail to a default operating parameter for the at least one power rail.

20. The method of claim 1, further comprising writing data bits indicative of the runtime power value to an operating register associated with the power rail, wherein modifying the operating parameter comprises modifying the power value for the power rail based on the runtime power value in the operating register.

\* \* \* \* \*